United States Patent
Kim (10) Patent No.: US 9,305,684 B2
(45) Date of Patent: Apr. 5, 2016

(54) SUBSTRATE GAP SUPPORTER AND METHOD FOR MANUFACTURING SAME

(75) Inventor: Jae Ku Kim, Seoul (KR)

(73) Assignee: GNE TECH CO., LTD., Gyeonggi-Do (KR)

( * ) Notice: Subject to any disclaimer, the term of this patent is extended or adjusted under 35 U.S.C. 154(b) by 428 days.

(21) Appl. No.: 13/808,580

(22) PCT Filed: Sep. 9, 2010

(86) PCT No.: PCT/KR2010/006143
§ 371 (c)(1),
(2), (4) Date: Jan. 4, 2013

(87) PCT Pub. No.: WO2012/005409
PCT Pub. Date: Jan. 12, 2012

(65) Prior Publication Data
US 2013/0115428 A1    May 9, 2013

(30) Foreign Application Priority Data

Jul. 7, 2010    (KR) .................. 10-2010-0065223

(51) Int. Cl.
| | | |
|---|---|---|
| *B32B 3/02* | (2006.01) | |
| *H01L 23/02* | (2006.01) | |
| *H01B 19/00* | (2006.01) | |
| *H05K 1/11* | (2006.01) | |
| *H01B 17/14* | (2006.01) | |
| *H05K 1/02* | (2006.01) | |
| *G02F 1/1345* | (2006.01) | |
| *H05K 3/34* | (2006.01) | |

(52) U.S. Cl.
CPC ............ *H01B 17/14* (2013.01); *G02F 1/13452* (2013.01); *H01B 19/00* (2013.01); *H05K 1/02* (2013.01); *H05K 1/115* (2013.01); *H05K 3/3442* (2013.01); *H05K 2201/10204* (2013.01); *H05K 2201/2036* (2013.01); *Y10T 29/49227* (2015.01); *Y10T 428/24488* (2015.01); *Y10T 428/31678* (2015.04)

(58) Field of Classification Search
None
See application file for complete search history.

(56) References Cited

PUBLICATIONS

The Hungry Mouse (http://www.thehungrymouse.com/2010/03/25/homemade-sandwich-bread/). Published online: Mar. 29, 2010 (Wayback Machine confirmed).*
Bhatt et al. (Sens. & Instrumen. Food Qual. (2010) 4:61-66). Published online: Apr. 18, 2010.*

* cited by examiner

*Primary Examiner* — David Sample
*Assistant Examiner* — Nicole T Gugliotta
(74) *Attorney, Agent, or Firm* — Revolution IP, PLLC (57) ABSTRACT

The substrate gap supporter (30) according to one embodiment of the present invention comprises a body (31) having a hexahedron shape and made of an insulator, metal foils (32a) and (32b) installed on opposite side surfaces of the body (31) to expose the upper portions of both side surfaces and cover the lower portions of both side surfaces, and a substrate (210) attached to the bottom surface of the body (31). According to the present invention, the gap supporter can be made through an automated process, thus precisely controlling size. Since the gap supporter is attached to the surface of the substrate, there is little possibility for a height difference to occur. And also, because the gap supporter can be installed in an automated process, it is suitable for a mass production process.

2 Claims, 11 Drawing Sheets

SUBSTRATE GAP SUPPORTER AND METHOD FOR MANUFACTURING SAME

CROSS REFERENCE TO PRIOR APPLICATIONS

This application is a National Stage Application of PCT International Patent Application No. PCT/KR2010/006143, filed on Sep. 9, 2010, under 35 U.S.C. §371, which claims priority to Korean Patent Application No. 10-2010-0065223, filed on Jul. 7, 2010, which are all hereby incorporated by reference in their entirety.

TECHNICAL FIELD

The invention relates to a substrate gap supporter(called as a substrate holder), and more particularly a substrate gap supporter which is attached and installed on a substrate so that operators don't need to manually fit it into holes of the substrate, and has a constant thickness at any cases even though being produced at large amount so that when it is attached to the substrate, gap between the substrate and other panel becomes constant. Moreover, the invention relates to a method suitable for manufacturing the substrate gap supporter.

BACKGROUND

Flat panel displays(FPD) such as LCD, LED, PDP and what have you have been already commercially used. As the flat panel displays become thin, the LCD panel and what have you and a PCB substrate mounted with a driving circuit for driving the LCD panel are located near to each other, thereby the PCB substrate being pressed by the LCD panel and what have you to cause problem of electrical disconnection. Moreover, because heights of electrical parts mounted on the PCB substrate or soldering parts aren't constant, when the PCB substrate and the LCD panel close to each other, height difference between them causes problem of flexing the PCB substrate.

Figure 1:
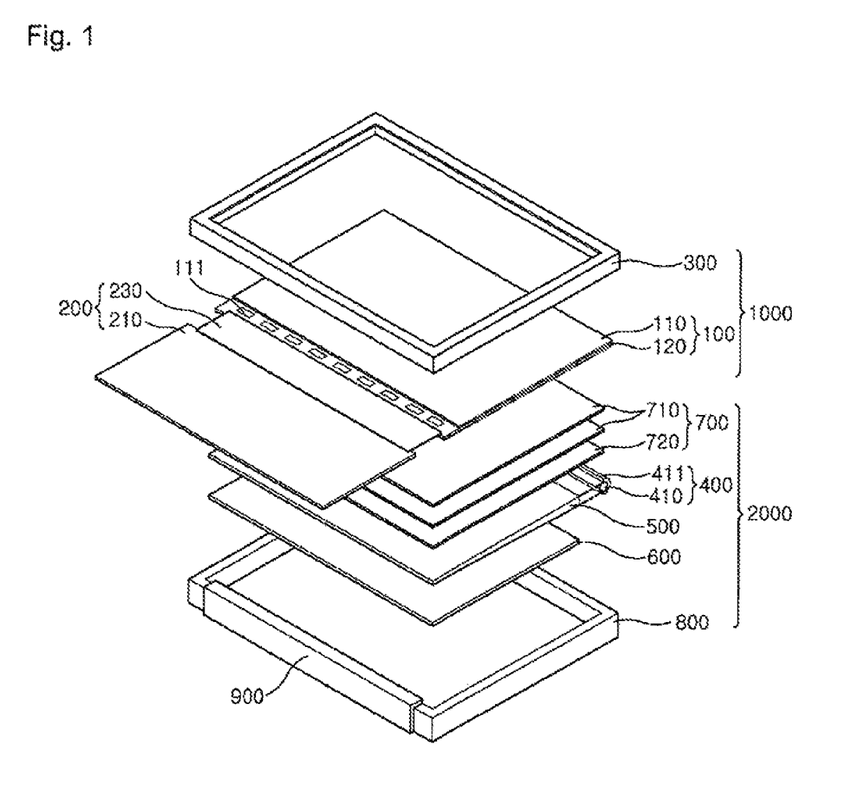
FIGS. 1 to 3 are views for describing the conventional LCD device.
Figure 2:
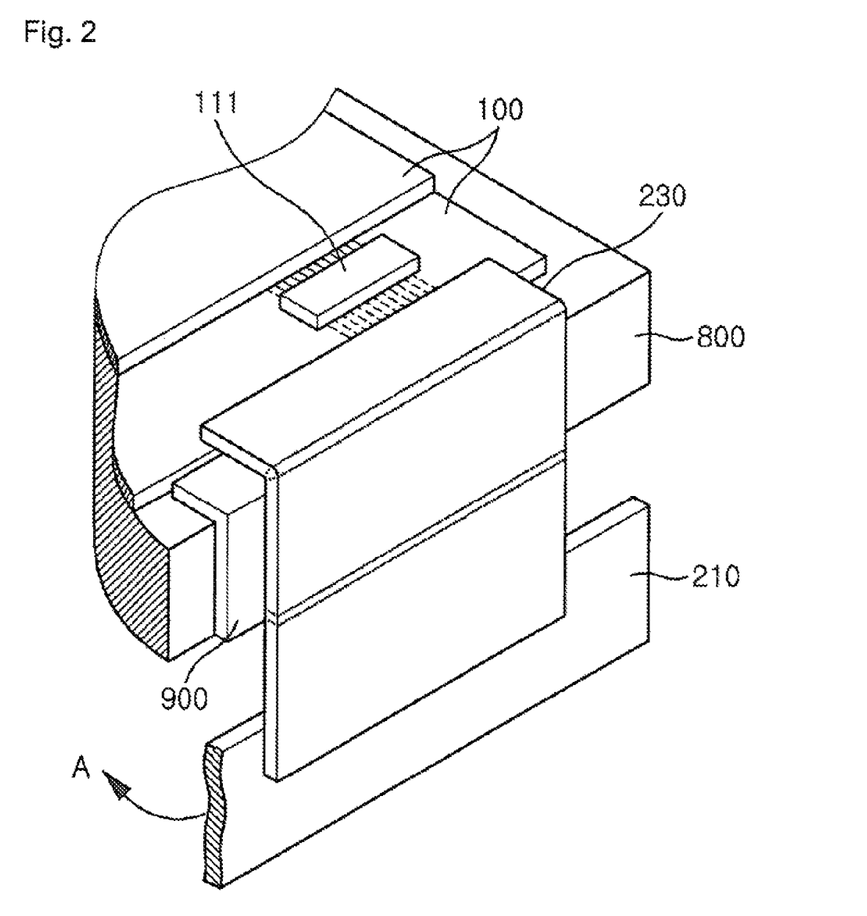
Figure 3:
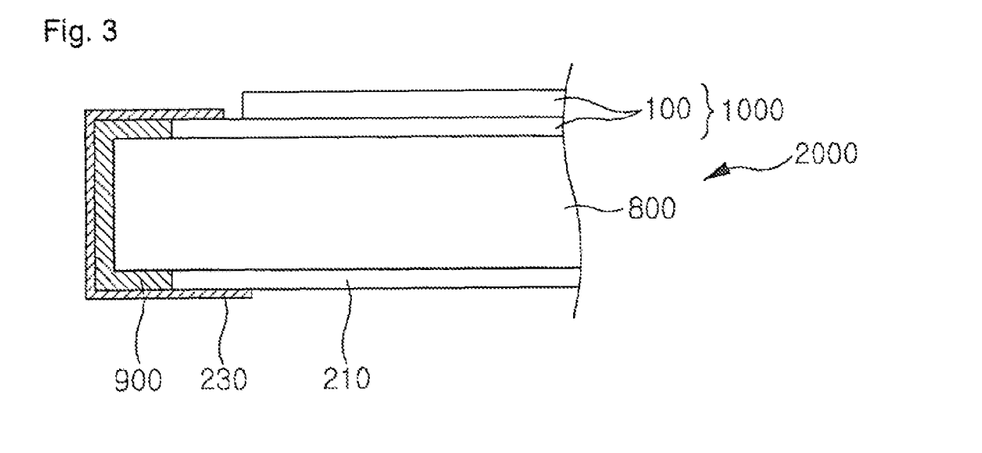

FIGS. 1 to 3 are views for describing the conventional LCD devices shown in the Republic of Korea Patent Publication No. 2007-5806 (Backlight assembly and liquid crystal display device for using same, which is publicized in Jan. 10 of 2007), wherein the FIG. 1 is a exploded perspective view, and FIGS. 2 and 3 are views for describing a situation where a flexible circuit substrate (230) is curved so that a printed circuit board (210) is located below a backlight assembly (2000).

Referring to the FIG. 1, the LCD device comprises a display assembly (1000) and the backlight assembly (2000), wherein the display assembly (1000) comprises a liquid crystal display panel (100), a driving circuit unit (200), and a upper receiving member (300), and the backlight assembly (2000) comprises a lamp unit (400), a light guide plate (500), a reflecting plate (600), an optical sheet (700), a lower receiving member (800), and a buffer member (900).

The liquid crystal display panel (100) is formed by stacking a color filter substrate (110) on a TFT substrate (120). A driving IC (111) installed in a circumferential portions of the TFT substrate (120) is connected to a PCB substrate (210) through the flexible circuit substrate (230). On the PCB substrate (210) are a control IC mounted so that it applies a given data signal and a gate signal to data lines and gate lines of the TFT substrate (120).

A linear light source type of light emitted from the lamp (410) installed in a lamp clamp (411) is converted through the light guiding plate (500) into a surface light source type of light, and evenly illuminated across the liquid crystal display panel (100) via an optical plate (710) and a diffusing plate (720).

A stacking structure from the reflecting plate (600) to the liquid crystal display panel (100) are firmly supported by the lower receiving member (800) and the upper receiving member (300), and the flexible circuit substrate (230) is curved downward as shown in the FIGS. 2 and 3 so that the PCB substrate (210) is located below the lower receiving member (800). On the lower receiving member (800) is the buffer member (900) mounted to prevent the flexible circuit substrate (230) from being damaged.

As such, in the conventional case, as the flat display device is made slim, the PCB substrate (210) is located below the lower receiving member (800) to be about attached to the member (800) so that some gap needs to be existed between the PCB substrate (210) and the lower receiving member (800) in order to protect electronic parts mounted on the PCB substrate (210).

Moreover, because heights of the electronic parts mounted on the PCB substrate (210) or soldering portions therefore aren't constant, when the PCB substrate (210) is attached to the lower receiving member (800), the PCB substrate (210) can be curved, so that some gap must be formed to prevent the curving. Accordingly, for forming such a gap, a gap supporter is installed between the lower receiving member (800) and the PCB substrate (210).

Figure 4:
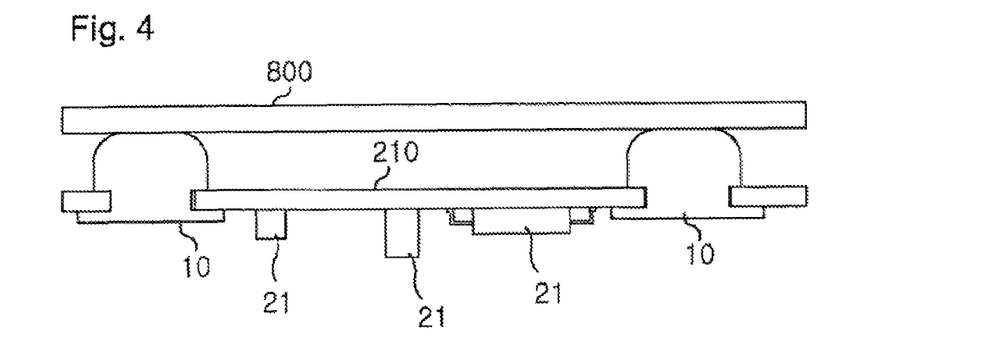
FIG. 4 is a view for describing the conventional gap supporter (10)

FIG. 4 is a view for describing a conventional gap supporter (10). As shown in the FIG. 4, because lead soldering portions for the electronic parts (21) are present on the back of the PCB substrate (210), if the PCB substrate (210) and the lower receiving member (800) are completely attached, the short will occur and so there will be concerns for electrical malfunction due to circuit's breaking, parts' burnings, and soldering portions' damages.

For preventing this, there are holes in the PCB substrate (210) and plastic-molded gap supporters (10) are pushed and fixed therein. Then, gap supporters (10) are fixedly connected to the PCB substrate (210) and a constant gap between the lower receiving member (800) and the PCB substrate (210) by means of the gap supporters (10) is present so that the potential in the PCB substrate (210) prevents the short between other wires to prevent circuit substrate and parts (21) from being burnt As mentioned above, the case that gap supporters (10) between the lower receiving member (800) and the PCB substrate (210) are installed is described, but the invention isn't restricted thereto and the same situation happens even between other panels and the PCB substrate so that the gap supporters (10) are installed. Moreover, the substrate installed with the gap supporters (10) isn't restricted to the PCB substrate but other types of substrates will corresponds thereto.

Moreover, for example gap supporters (10) are installed on the back of the PCB substrate (210), but the invention isn't restricted thereto and they are installed on the front of the PCB substrate (210), that is the gap supporters (10) may be installed on the front of the PCB substrate (210) when the surface mounted with electronic parts (21) is attached to other panels.

The PCB substrate (210) for driving the liquid crystal display panel (100) is illustrated but other than that gap supporters (10) may be installed in various PCB substrates such as the PCB substrate, the backlight PCB substrate, the power source PCB bard and what have you.

However, conventional gap supporters (10) must be installed while operators manually push and fix them one by one into holes of the PCB substrate (10) so that they have disadvantages in terms of installation cost and time. Moreover, this manually fixing-into-holes method causes a plurality of gap supporters (10) not to all be protruded at a constant height and some height difference so that there is also a problem that a gap between the PCB substrate (10) and the panel isn't constant.

DETAILED DESCRIPTION OF THE INVENTION

Technical Subject

Accordingly, it is a subject to be solved to provide a substrate gap supporter and method for manufacturing same wherein the supporters are attached and installed on the substrate s that operators don't need to manually fix them into holes of the substrate one by one and can install them by an automation process, and even though produced at large amount all of the supporters have constant thicknesses so that when they are attached onto the substrate by soldering a gap between the substrate and other panels is constant.

Means to Solve Subject

For accomplishing the subject, substrate gap supporter according to one aspect of the invention is characterized in that it comprises a six-sided object shaped body which is made of an insulator; and metal foils installed on both opposite sides of the body, and installed in a lower portion of the both sides so as to make a upper portion of the both sides exposed and a lower portion of the both sides of the body covered, wherein a bottom of the body is installed to be attached to the substrate.

Then, it is desirable that a upper edge and apex portions of the body are trimmed to be slanted.

Through holes can be formed in the body to penetrate both sides installed with the metal foil, and in that case metal plugs are embedded in the through holes to connect the metal foils formed on both sides of the body to each other.

A method for manufacturing substrate gap supporter according to one aspect of the invention for accomplishing the subject is characterized in that the method comprises a first step of forming metal foils on both sides of an insulating plate; a second step of etching the metal foils to expose the insulating plate so that a plurality of stripes are arranged on both sides of the insulating plate in parallel at constant intervals, wherein the stripes expose the insulating plate at constant widths; and a third step of cutting in direction in parallel with the stripes and in direction in vertical with the stripes along one edges of the stripes to complete the gap supporter.

After the first step, It is possible to comprise steps of forming the through holes to be arranged in the insulating plate in matrix shape to penetrate the metal foils; and performing a metal plating on a result formed with the through holes to form a plating foil on the metal foil and forming metal plugs within the through holes, wherein in this case the stripes in the second step are formed by etching the metal foil and the plating foil.

It is desirable that gap supporters completed in the fourth step comprise one metal plug.

A method for manufacturing a substrate gap supporter according to another aspect of the invention for accomplishing the subject is characterized in that the method comprises a first step of forming metal foils on both sides of an insulating plate; a second step of etching the metal foils to expose the insulating plate so that a plurality of stripes are arranged on both sides of the insulating plate in parallel with one another at constant intervals, wherein the stripes expose the insulating plate at constant widths; and a third step of cutting in direction in parallel with the stripes along a center of the stripes, in direction in parallel with the stripes along a center between the stripes, and in direction in vertical with the stripes to complete the gap supporter.

After the first step, it is possible to comprise forming a plurality of through holes in the insulating plate in matrix shape to penetrate the metal foil, wherein the through holes close to one another to form a set of two lines of holes, and each of set of holes is formed to be spaced farther than a line interval within the set of hole; performing a metal plating on a result formed with the through holes to form a plating foil on the metal foil and forming metal plugs within the through holes, wherein in this case the stripes in the second step are formed by etching the metal foil and the plating foil to arrange the set of through holes between the stripes, and during the cutting in the third step two line of through holes in the set of the through holes are cut to divide the two line into one line separately.

After the second step, it is possible to form V recess lines in parallel with the stripes along the center of the stripes, and form trimming holes in the V recess lines at constant intervals to penetrate the insulating plate. In this case, cutting lines for case of cutting in parallel with the stripes along the center of the stripes run the centers of the V recess lines, and cutting lines for case of cutting in vertical with the stripes run the trimming holes.

A substrate gap supporter according to another example for accomplishing the subject is characterized in that it comprises a six-sided object shaped body which is made of an insulator; and a metal foil installed on a bottom of the body, wherein the metal foil is installed by being attached to the substrate.

It is desirable that a upper edge and an apex portions of the body is trimmed to be slanted.

A method for manufacturing a substrate gap supporter according to still another example of the example for accomplishing the subject is characterized in that the method comprises a first step of forming a metal foil on one side of an insulating plate; a second step of forming V recess lines on other side not to be formed with the metal foil to be vertically crossed to one another in grid shape; and a third step of cutting along a center of the V recess lines to complete a gap supporter.

Effect of the invention

According to the invention, it is possible to make a gap supporter through the automation process so that sizes of the gap supporter can be precisely controlled, and the gap supporter can be attached and installed on the surface of the substrate so that there is less concern for the installation height difference, and can be also installed by the automation process to be suitable for the large production process

DESCRIPTION OF REFERENCE NUMBER

30: Gap supporter
31: Body
32a, 32b, 320a, 320b, 340a, 340b: Metal foil
33: Metal plug
40: Soldering
50: Stripe
55, 55a, 55b: V recess line
56: Trimming hole
210: PCB substrate
310: Isolating plate
330: Through hole Embodiment of the invention As described below, desirable embodiments of the invention will be specifically described with reference to accompanying figures. Below embodiments will only be provided to understand the content of the invention and it should be appreciated by person skilled in the art that various modifications are possible within the technical scope of the invention. Therefore, the right scope of the invention isn't intended to be interpreted to be restricted to those embodiments.

[Embodiment 1]

Figure 5:
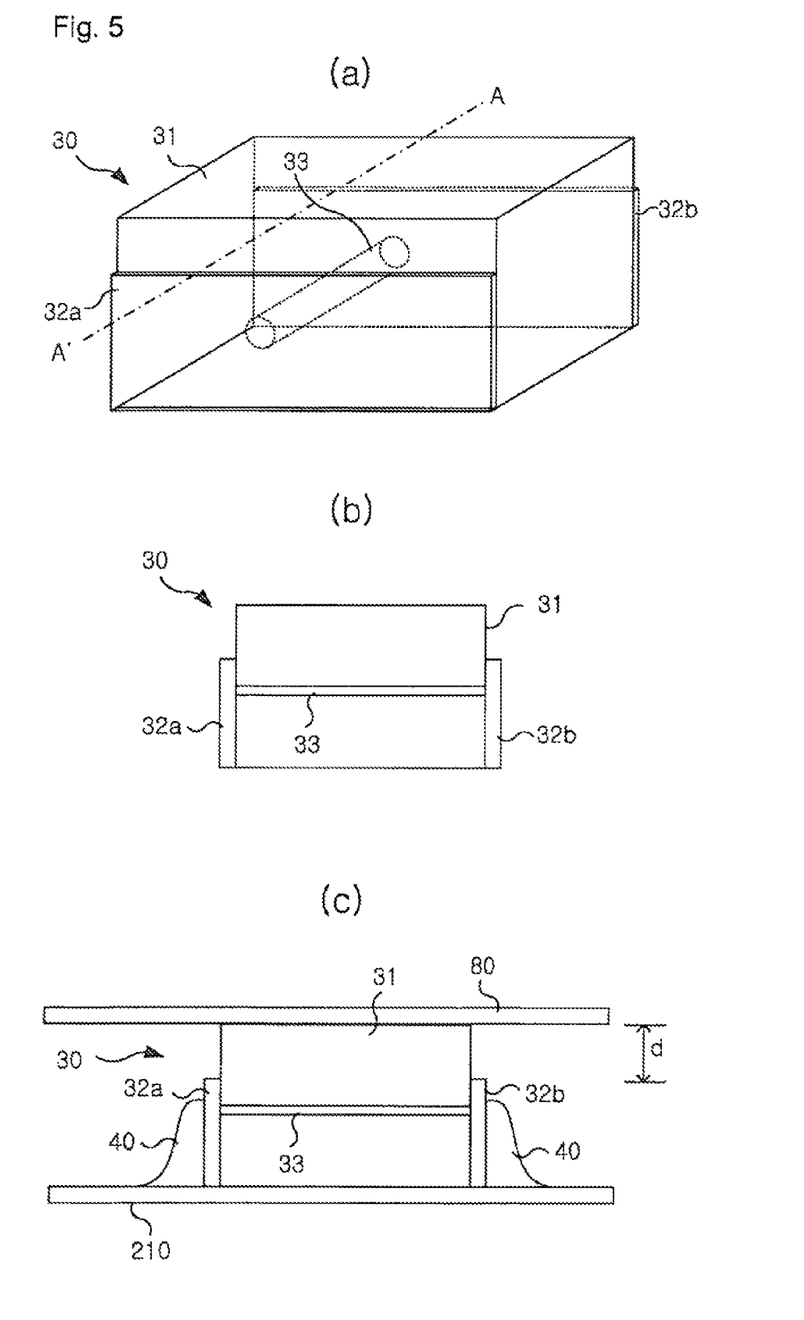
FIG. 5 is a view for describing a gap supporter (30) according to the first embodiment of the invention.

FIG. 5 is a view for describing a gap supporter (30) according to the first embodiment of the invention, wherein FIG. 5a is a perspective view for the supporter, FIG. 5b is a vertical sectional view according to a A-A' line of the FIG. 5a, and FIG. 5c is a side view for describing situation where the gap supporter (30) is installed in a PCB substrate (210).

Referring to FIGS. 5a to 5c, a gap supporter (30) according to the invention has a six-sided shaped body (31) which is made of an insulator such as an epoxy or plastic, and metal foils (32a, 32b) are attached and installed on both opposite sides of the body (31). The metal foils (32a, 32b) are installed in the under portions of the both sides of the body so that the upper portion of sides of the body (31) is exposed and the lower portion is covered.

In the body (31), through hole are formed to penetrate both sides installed with the metal foils (32a, 32b), and metal plugs (33) are embedded in the through holes to connect the metal foil (32a, 32b) to each other. The metal plugs (33) have a role of preventing the metal foils (32a, 32b) from being stripped from the both sides of the body (31) to increase the reliability of the gap supporter (30). If there is no concern for the metal foils (32a, 32b) being stripped, the metal plugs (33) will not be necessarily needed.

As shown in the FIG. 5c, the gap supporter (30) is fixed and installed to the PCB substrate (210) by soldering (40) the metal foils (32a, 32b) and the PCB substrate (210) with the bottom of the body (31) attached to the PCB substrate (210). The metal foil (32a, 32b) is installed for soldering like that. The gap supporter (30) can be attached to the PCB substrate (210) by the bottom of the body (31) being bonded to the PCB substrate (210) with an adhesive.

Because the bottom of the body (31) is attached to the PCB (210), the metal foils (32a, 32b) are adjacent to the PCB substrate (210) but not adjacent to and spaced from the panel (80) by a distance d. When the metal foils (32a, 32b) are installed to the upper portions of the both sides of the body (31), the metal foils (32a, 32b) and the panel (80) are abut so that the PCB substrate (210) and the panel (80) are undesirably electrically connected to cause electrical short. Accordingly, the metal foils (32a, 32b) are installed only in the lower portions of the both sides of the body (31) as shown above.

According to the invention, a gap supporter is directly attached and installed on the PCB substrate, on the contrary to the conventional case of inserting and installing the gap supporter into holes of the PCB substrate, so that on the contrary to the conventional case of manually installing the gap supporter the gap supporter can be automatically installed through the automation of attaching process.

Manufacturing Method 1

Figure 6:
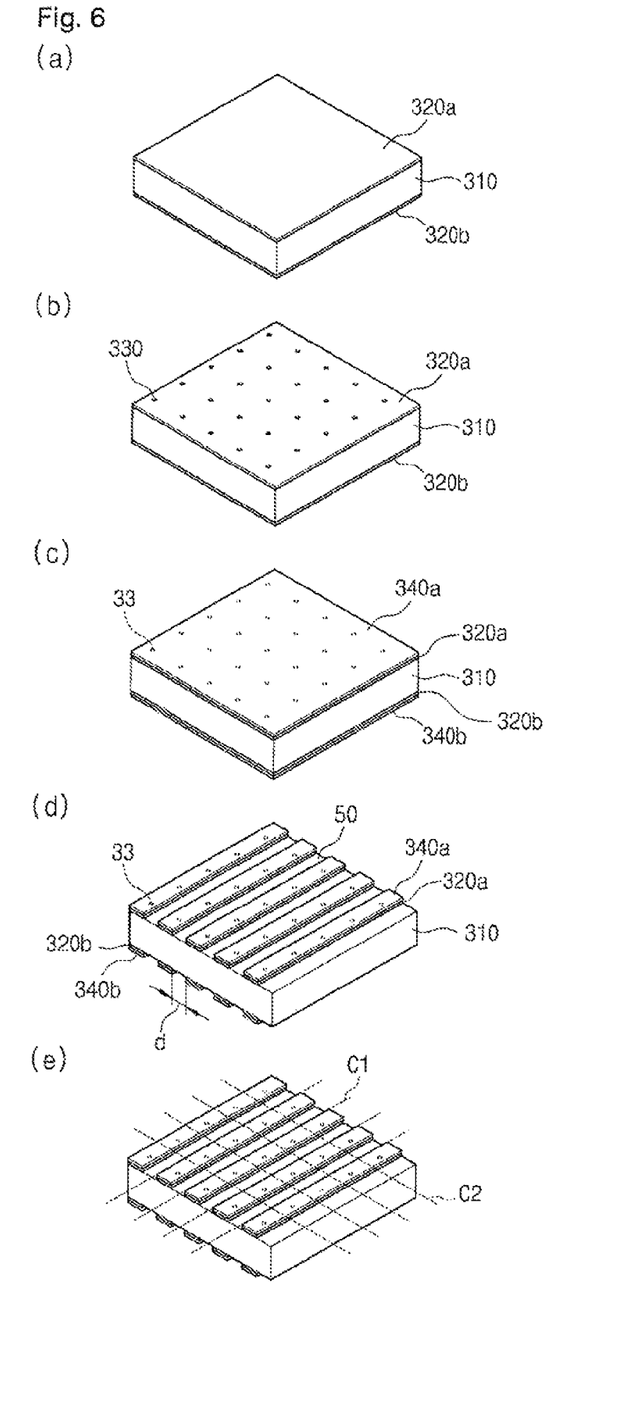
FIG. 6 is a view for describing one example of a method for manufacturing the gap supporter (30) according to the FIG. 5.

FIG. 6 is a view for describing one example of the method for manufacturing a gap supporter (30) according to the FIG. 5. Initially, as shown in FIG. 6a, an insulating plate (310) applied on its both sides with the primary metal foils (320a, 320b), for example copper foils is prepared, and as shown FIG. 6b through holes (330) with a diameter of about 0.5 mm are regularly formed in the insulating plate (310) in matrix shape to penetrate the primary metal foils (320a, 320b).

Then, as shown in FIG. 6c, metal plating, for example a copper plating is performed over an entire result formed with the through holes (330). Then, within the through holes (330) as well as portions with the primary metal foils (320a, 320b) are metal-plated so that secondary metal foils (340a, 340b) are formed on the primary metal foils (320a, 320b) and metal plugs (33) which are made of a copper are formed within the through holes (330).

Subsequently, the secondary metal foils (340a, 340b) and the primary metal foils (320a, 320b) are etched with a photolithograph process to expose the insulating plate (310) as shown in FIG. 6d, so that a plurality of stripes (50) with a constant width (d) are arranged on both sides of the insulating plate (310) in parallel with one another at constant intervals.

Figure 7:
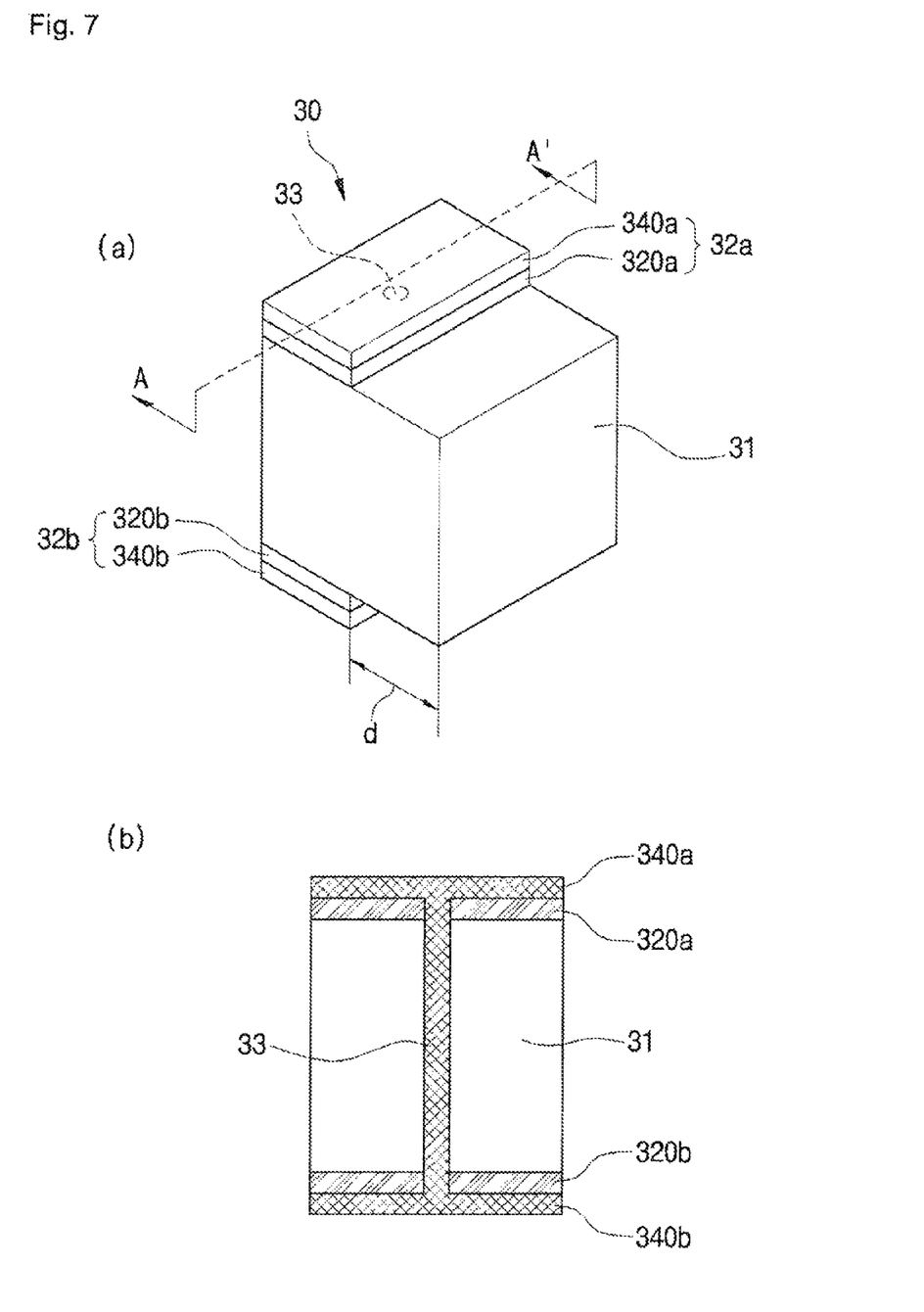
FIG. 7 is a view for describing the gap supporter (30) completed through the manufacturing method of the FIG. 6.

Finally, the first cutting (C1) along one edge of the stripes (50) and the second cutting (C2) vertically with the primary cutting are performed to cut the insulating plate (310) in matrix shape as shown in FIG. 6e so that a gap supporter (30) with only one metal plug (33) is completed as shown in FIG. 7. the order of the primary cutting (C1) and the secondary cutting (C2) can be reversed.

FIG. 7 is a view for describing the gap supporter (30) completed through the manufacturing method of the FIG. 6, the FIG. 7a is an external perspective view, and the FIG. 7b is a vertical cross-sectional view taken along the A-A' line of the FIG. 7a. As shown in the FIG. 7, the metal foils (32a, 32b) formed on both sides of the body (31) can't be easily stripped from the body (31) due to the metal plugs (33) so that it can appropriately function during soldering operation. if the gap supporter (30) lying on its side as shown in the FIG. 7 is raised as shown in the FIG. 5 to be soldered to the PCB substrate (210), constant gap will be formed between the PCB substrate (210) and the panel (80).

According to this manufacturing method, a size of the gap supporter (30) can be constant through the automation of the cutting process (FIG. 6e) so that the height of the gap supporter (30) can be constant. Accordingly, gap between the PCB substrate (210) and the panel (80) can be constant and the gap supporter (30) can be also attached onto the PCB substrate (210) so that the automation of the attaching process allows the gap supporter (30) to be automatically installed with easy.

Manufacturing Method 2

Figure 8:
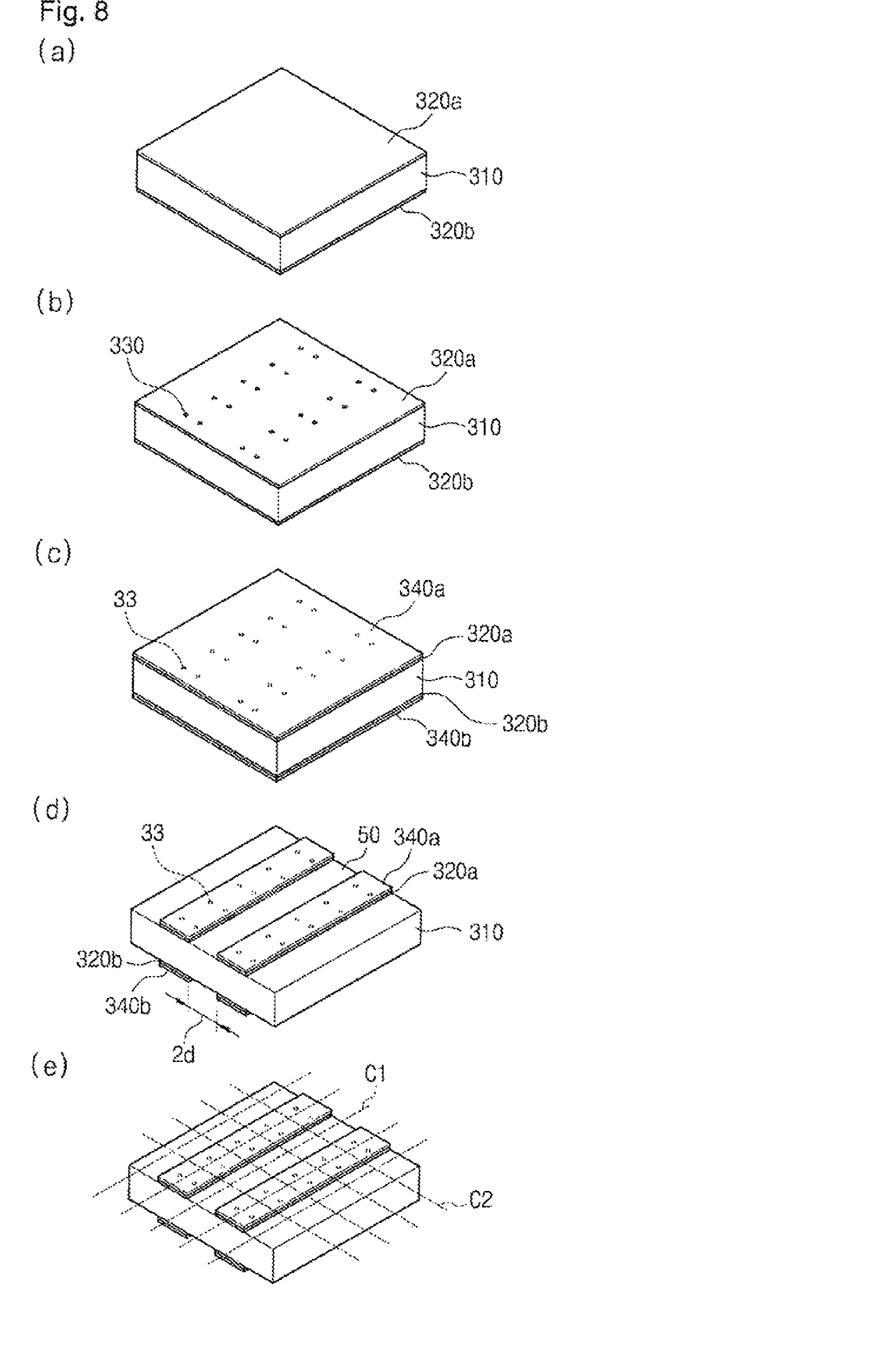
FIG. 8 is a view for describing another example of the manufacturing method of the gap supporter (30) according to the FIG. 5.

FIG. 8 is a view for describing another example of the method of manufacturing the gap supporter (30) according to the FIG. 5. Initially, as shown in the FIG. 8a, an insulating plate (310) applied on both sides thereof with the primary metal foils (320a, 320b), for example copper foils is prepared, and as shown in the FIG. 8b through holes (330) with a diameter of about 0.5 mm are formed in the insulating plate (310) to penetrate the primary metal foils (320a, 320b). Then, on the contrary with the FIG. 6b, the through holes (330) are close to one another to make two lines being one set, and each set is spaced apart from one another farther than a line interval within the set.

Subsequentially, as shown in the FIG. 8c, a metal plating, for example a copper plating is performed across the result formed with the through holes (330). Then, the metal plating is performed on the through holes (330) as well as portions with the primary metal foils (320a, 320b) so that the secondary foils (340a, 340b) are formed on the primary metal foils (320a, 320b) and metal plugs (33) which are made of a copper are formed.

Then, as shown in the FIG. 8d, the secondary metal foils (340a, 340b) and the primary metal foils (320a, 320b) are etched through a photolithograph process to expose the insulating plate (310) so that a plurality of stripes (50) with a constant width (2d) are arranged on both sides of the insulating plate (310) in parallel with one another at constant intervals. Then, on the contrary to the FIG. 6d, the one set (two lines) of through holes (330) are arranged between the stripes (50).

Finally, as shown in the FIG. 8e, the first cutting (C1) in parallel with the stripes (50) along the center of the stripes (50) and in parallel with the stripes (50) along the center among the stripes (50) in order to divide two lines of the through holes (330) among the stripes (50) into one line separately, and the second cutting (C2) vertically with the first cutting (C1) are performed so that the insulating plate (310) is cut in grid shape, thereby completing the gap supporter (30) with one metal plug (33) as shown in the FIG. 7. Then, the order of the first cutting (C1) and the second cutting (C2) can be also reversed.

[Embodiment 2]

Figure 10:
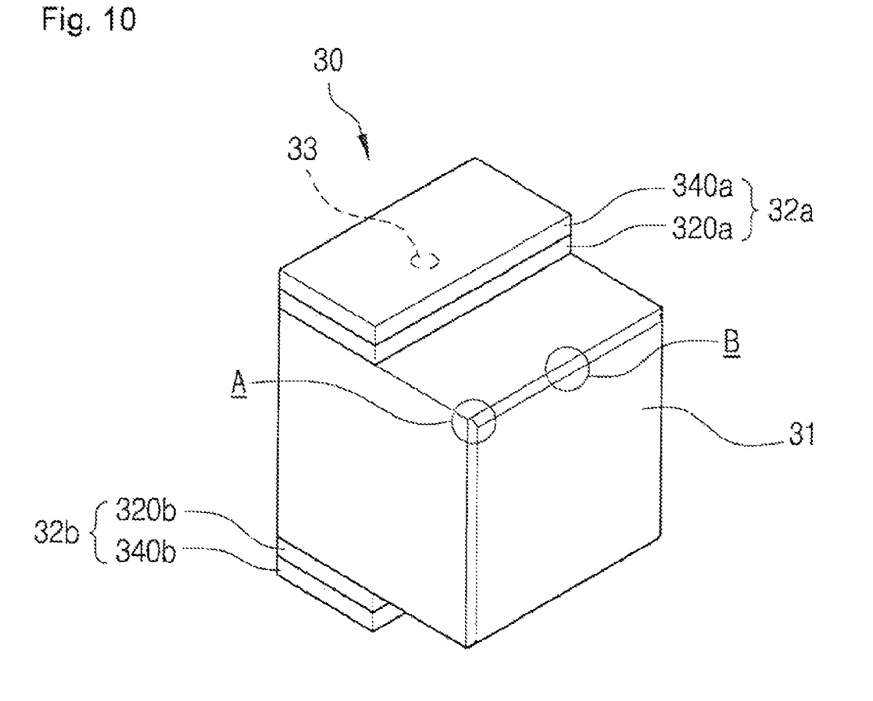
FIG. 10 is a view for describing the gap supporter (30) according to a second embodiment of the invention.

FIG. 10 is a view for describing the gap supporter (30) according to the second embodiment of the invention. As shown in the FIG. 10, the second embodiment has the same structure as that of the FIG. 7 and is characterized in that when the gap supporter (30) is installed in the PCB substrate (210) the gap supporter's edge (B) and apex (A) are trimmed to be slanted. This is for the purpose of preventing the panel (80) from being damaged due to being depressed or tore by the angled edge and apex of the gap supporter (30) when the gap supporter (30) is installed as shown the FIG. 5c.

Figure 9:
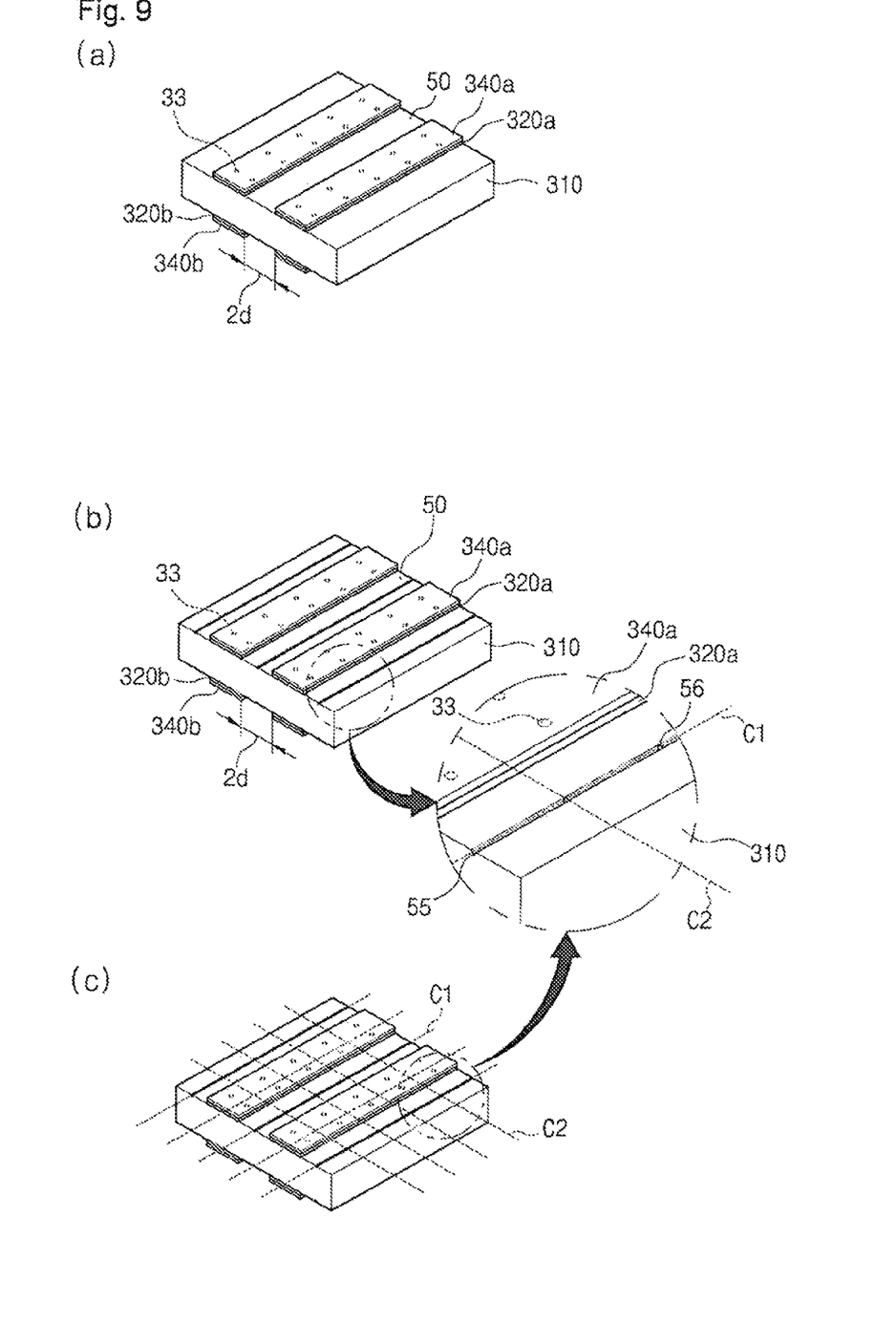
FIG. 9 is a view for describing a method for manufacturing a gap supporter (30) of FIG. 10.

FIG. 9 is a view for describing a method for manufacturing the gap supporter of the FIG. 10, experiences the same process as that of the FIG. 8, and as shown in the FIG. 9b is characterized in that it has a step of forming V recess lines (55) and trimming holes (56).

Specifically, V recess lines (55) are formed in parallel with the stripes (50) along a center of the stripes (50), and trimming holes (56) are formed on the V recess lines (55). Then, the trimming holes (55) will be located between the metal plugs (33). the trimming holes (55) are desirably in circle or diamond shape in their sections, but aren't restricted to a specific shape.

Moreover, as shown in FIG. 9c, the first cutting (C1) of a center of the V recess lines (55), and a center of the stripes (50) so that two line of through holes (330) which is in one set are divided into one line separately, and the second cutting (C2) to be run through the trimming holes (56) in vertical with the first cutting (C1) cause the insulating plate (310) to be cut in grid shape. Then, as shown in the FIG. 10, when the gap supporter (30) is raised, the edge (B) and the apex (A) which are located in the upper portion are trimmed to be slanted.

[Embodiment 3]

Figure 12:
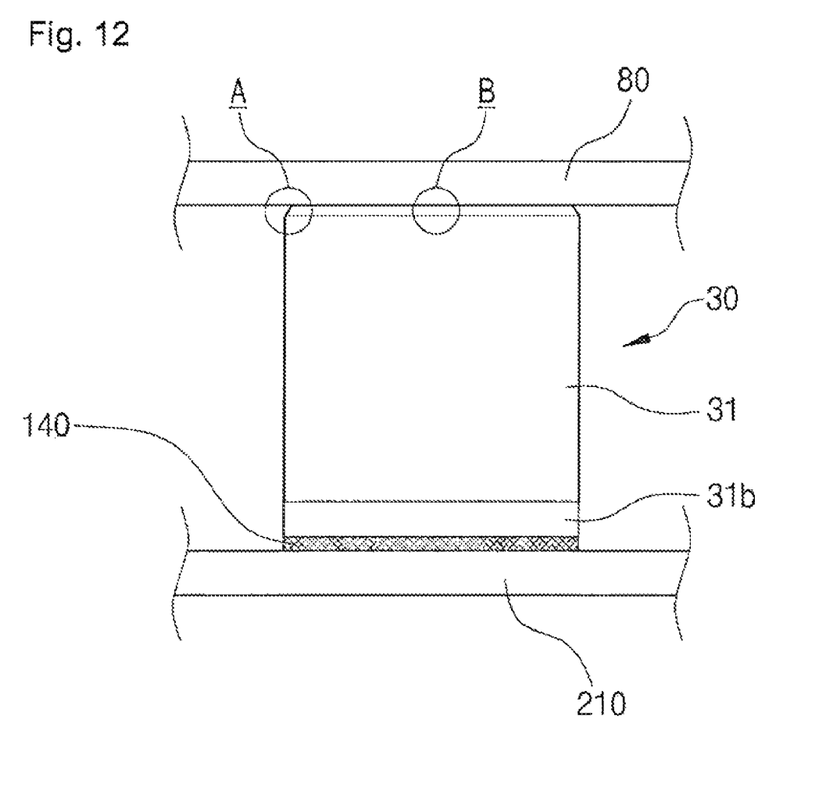
FIG. 12 is a view for describing the gap supporter (30) according to a third embodiment of the invention.

FIG. 12 is a view for describing the gap supporter (30) according to the third embodiment of the invention. As shown in the FIG. 12, the gap supporter (30) according to the third embodiment is characterized in that it comprises a metal foil (31b) attached and installed on a bottom of the six-sided object shaped body (31) and a portion with the metal foil (31b) attached and installed in the PCB substrate (210) by an adhesive (140) and what have you. When the gap supporter (30) is attached to the PCB substrate (210), the edge (B) and the apex (A) which are located in the upper portion are trimmed to be slanted. Such a trimming doesn't need to be done, but is desirable to be present for preventing the panel (80) from be damaged as mentioned above.

Figure 11:
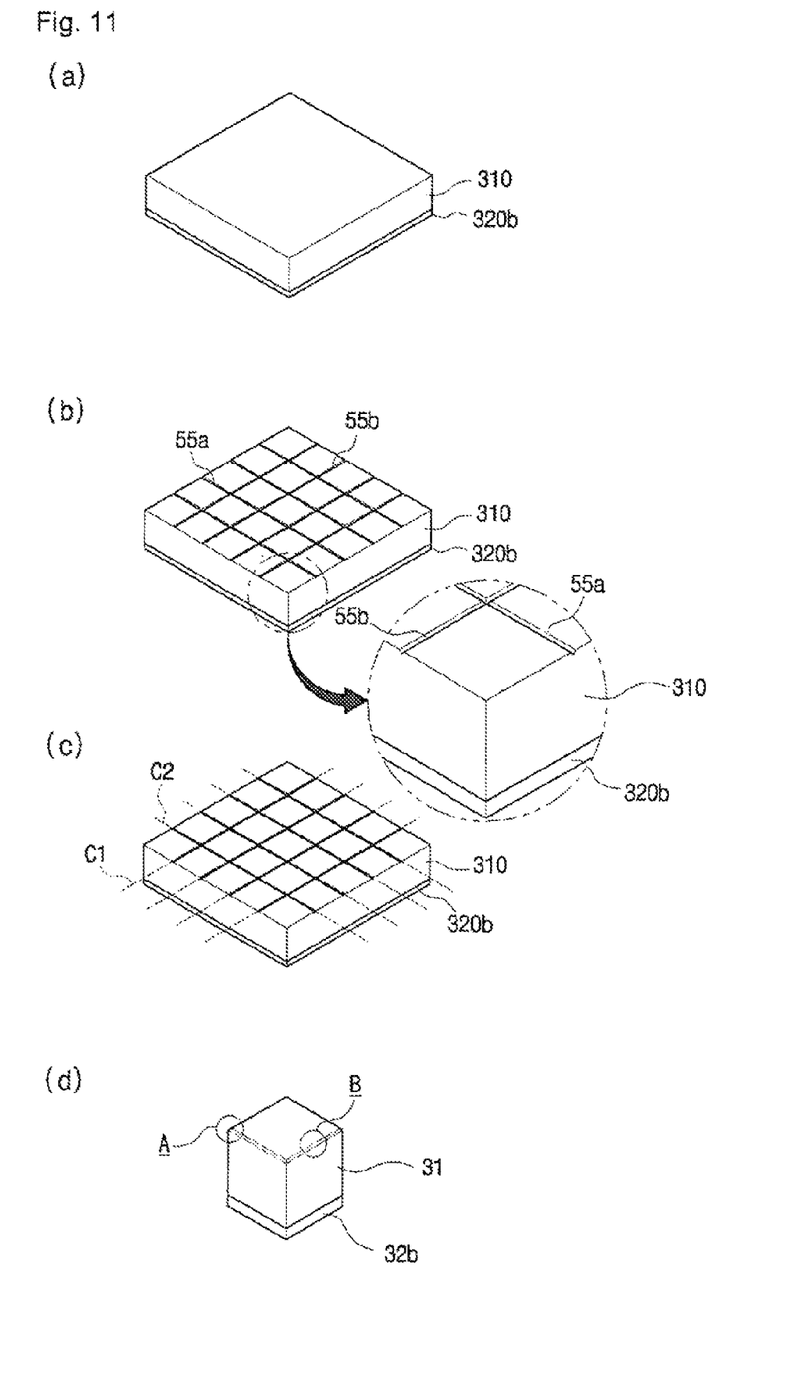
FIG. 11 is a view for describing a method for manufacturing a gap supporter (30) of FIG. 12.

FIG. 11 is a view for describing a method for manufacturing the gap supporter (30) of the FIG. 12, and as shown in the FIG. 11a, a metal foil (320b) is formed in only one side of the insulating plate(310). As shown in the FIG. 11b, V recess lines (55a, 55b) are formed to be vertically crossed to one another on the other side in which the metal foil (32b) isn't formed. Moreover, as shown in FIG. 11 c, when cutting along a center of the V recess lines (55a, 55b), the apex (A) and edge (B) being abut to the panel (80) are trimmed as shown in the FIG. 11d.

As mentioned above, the gap supporter (30) according to the invention doesn't have concern for the panel (80) being depressed or tore due to the angled edge and apex because the upper edge and apex which are contacted to the panel (80) are trimmed to be slanted.

The invention claimed is:

1. A substrate gap supporter to be installed in a substrate in order to make the substrate not contact with other portions but be spaced from the other portions, the substrate gap supporter comprising:
    a six-sided object shaped body which is made of an insulator; and
    metal foils installed on both opposite sides of the body, and installed in a lower portion of the both sides so as to make an upper portion of the both sides exposed and a lower portion of the both sides of the body covered,
    wherein a bottom of the body is installed to be attached to the substrate,
    wherein the substrate gap supporter further comprises;
    through holes formed in the body to penetrate both sides installed with the metal foils; and
    metal plugs embedded in the through holes to connect the metal foils formed on both sides of the body to each other.

2. The supporter of claim 1, wherein an upper edge and apex portions of the body are trimmed to be slanted.

* * * * *